United States Patent [19]
Mantov

[11] Patent Number: 6,163,204
[45] Date of Patent: Dec. 19, 2000

[54] FAST AC SENSOR FOR DETECTING POWER OUTAGES

[75] Inventor: Gueorgui I. Mantov, Lexington, Ohio

[73] Assignee: Peco II, Inc., Galion, Ohio

[21] Appl. No.: 09/203,439

[22] Filed: Dec. 1, 1998

[51] Int. Cl.$^7$ .................................................. H01J 19/82
[52] U.S. Cl. ............................................ 327/531; 327/143
[58] Field of Search ............................... 327/20, 531, 91, 327/94, 336, 143, 198, 545, 546

[56] References Cited

U.S. PATENT DOCUMENTS

| | | | |
|---|---|---|---|
| 4,939,472 | 7/1990 | Uchida et al. | 327/91 |
| 5,036,289 | 7/1991 | Duran | 327/94 |
| 5,324,995 | 6/1994 | Yee | 327/91 |
| 5,554,944 | 9/1996 | Van Buul et al. | 327/91 |
| 5,872,470 | 2/1999 | Mallinson et al. | 327/94 |

*Primary Examiner*—Toan Tran
*Assistant Examiner*—Paul Dinh
*Attorney, Agent, or Firm*—Marshall, O'Toole, Gerstein, Murray & Borun

[57] ABSTRACT

An AC sensor for measuring voltage and detecting power outages is disclosed. In a disclosed embodiment, the AC sensor includes a plurality of integrators for independently integrating an AC voltage present on the AC power line. It also includes a timing circuit in communication with the integrators. The timing circuit initiates the integration cycles of the integrator such that the integration cycles are staggered in time and such that every two sequentially occurring integration cycles partially overlap.

43 Claims, 7 Drawing Sheets

FAST AC SENSOR FOR DETECTING POWER OUTAGES

FIELD OF THE INVENTION

The invention relates generally to measuring AC line voltage and, more particularly, to a sensor for quickly determining power outages on an AC power line or the like.

BACKGROUND OF THE INVENTION

Figure 1:
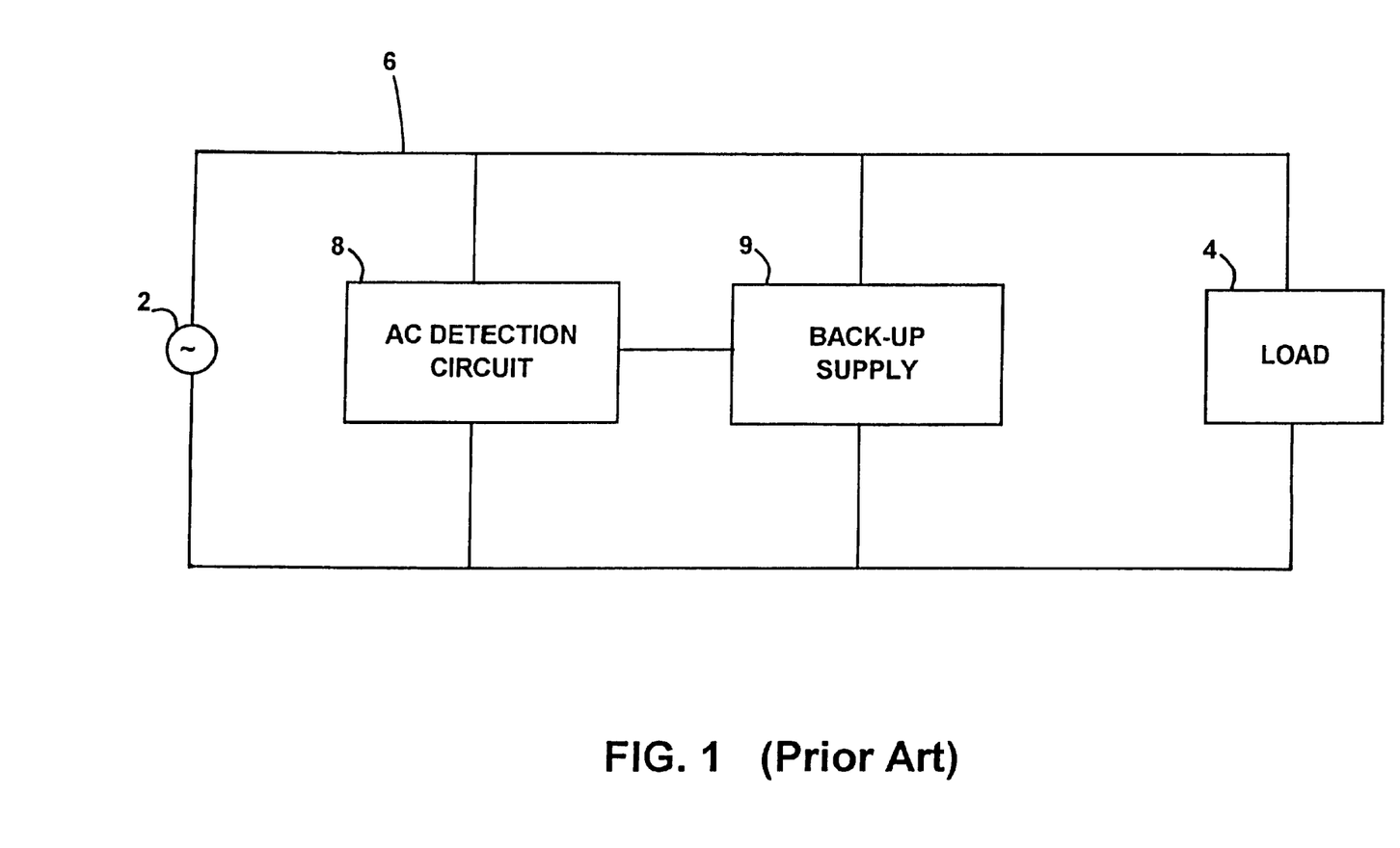
FIG. 1 is a block diagram of a prior art power supply system employing a UPS.

A typical power supply system is schematically illustrated in FIG. 1. In such a system, an AC supply such as a commercial power system 2 is typically used to supply power to a load 4 over transmission lines 6. Unfortunately, such commercial supplies fail from time to time (for example, due to lightning strikes). Such power failures are undesirable, and, in some instances, catastrophic (e.g., power to life support equipment, etc.). To avoid such problems, prior art systems have provided back-up power supplies, typically referred to as uninterruptible power supplies (UPS). Such back-up power supplies typically include an AC detection circuit 8 for monitoring the AC line voltage developed by the commercial power system 2. They also include a back-up supply 9, which usually comprises a DC power source such as a string of rechargable batteries and a DC to AC converter such as an inverter. In the event of a sufficient drop in the AC line voltage detected by the detection circuit 8, the back-up supply 9 is brought on line to supply power to the load 4.

Within this context, it is important to accurately and quickly measure the AC line voltage to identify power outages on the AC power line 6. Specifically, any delay between the occurrence of a power failure and the detection of that failure creates an interval during which power is not supplied to the load 4. Such a delay in bringing the back-up supply 9 on line can result in data loss and/or equipment failure.

In view of the foregoing, it will be appreciated that detecting power outages and providing fast and accurate information about the AC line voltages are of primary importance to UPS systems. As a result, many schemes for sensing power outages have been proposed. However, none of the proposed schemes provide accurate information about the measured AC voltage in sufficient short time frames.

For example, in a typical prior art approach, the AC detection circuit includes one fast AC sensor for quickly identifying a power outage and one slow AC sensor to accurately measure the AC line voltage. This approach, however, is disadvantageous in that the difference in detection speed between these sensors inherently guarantees that a delay between the detection of an outage and the provision of accurate voltage information relating to that outage will always be present. Indeed, the time period between the power outage and the moment of receiving accurate information about the measured AC line voltage under such approaches is approximately one-half the time period of the AC voltage waveform on the AC power line.

SUMMARY OF THE INVENTION

In accordance with an aspect of the present invention, an AC sensor for detecting outages on an AC power line is provided. The AC sensor comprises a first integrator for integrating an AC voltage on the AC power line during a first predetermined time period. The first predetermined time period has a first start time and a first end time. The AC sensor also includes a second integrator for integrating the AC voltage on the power line during a second predetermined time period. The second predetermined time period has a second start time and a second end time. In addition, the sensor includes a timing circuit in communication with the first and second integrators for determining the first and second start times and the first and second end times such that the second start time occurs after the first start time and before the first end time.

In a preferred embodiment, the sensor includes a sample and hold circuit in communication with the first and second integrators. The sample and hold circuit periodically samples and stores a first output voltage developed by the first integrator and a second output voltage developed by the second integrator. Preferably, the sample and hold circuit samples the first output voltage at the end of the first predetermined time period and samples the second output voltage at the end of the second predetermined time period.

In any of the foregoing embodiments, the sample and hold circuit may be in communication with the timing circuit such that the timing circuit can define the times at which the sample and hold circuit samples the first and second output voltages.

In some embodiments, the sample and hold circuit comprises a multiplexer having an output, a first input coupled to an output of the first integrator, and a second input coupled to an output of the second integrator. It also preferably includes a capacitor coupled to the output of the multiplexer.

In any of the foregoing embodiments, the sensor may also include a rectifier having an input coupled to the AC power line and an output coupled to respective inputs of the first and second integrators for providing a rectified AC voltage thereto.

In some embodiments the first predetermined time period lasts for one-half a period of the AC voltage and the second predetermined time period lasts for one-half the period of the AC voltage.

In any of the foregoing embodiments, the first and second predetermined time periods may be asynchronous with the phase of the AC voltage.

In some embodiments, the timing circuit comprises an oscillator which develops a clock signal, a counter in communication with the oscillator, a trigger circuit in communication with the counter, and a decoder in communication with the counter and the trigger circuit. The counter is responsive to the clock signal to develop a select signal and an enable signal. The trigger circuit is responsive to the enable signal to develop a first output signal. The decoder is responsive to the first output signal to output a first reset signal to the first integrator when the select signal has a first state, and to output a second reset signal to the second integrator when the select signal has a second state. In some such embodiments, the trigger circuit develops a second output signal in response to the enable signal, the trigger circuit is in communication with the sample and hold circuit, and a sample and hold circuit is responsive to the second output signal to sample the first output voltage from the first integrator when the select signal has the first state, and to sample the second output voltage from the second integrator when the select signal has the second state. The first output signal of the trigger circuit is delayed relative to the second output signal.

In some embodiments, the select signal may encode a binary number.

In any of the foregoing embodiments, the select signal may comprise at least two synchronized signals encoding a binary number.

In some embodiments, the clock signal has a frequency which is related to the frequency of the AC voltage by the equation $Fcl=2^N*2*k*Fac$, where Fac is the frequency of the AC signal provided by the AC signal source, k is the number of integrators used in the AC sensor, and N is the lowest index of the counter output.

In any of the foregoing embodiments, the trigger circuit may comprise a Schmitt Trigger inverter and an RC circuit.

In accordance with another aspect of the invention, an AC sensor including a plurality of integrators for independently integrating an AC voltage on the AC power line is provided. Each of the integrators has an integration cycle. The AC sensor also includes a timing circuit in communication with the integrators. The timing circuit initiates the integration cycles of the integrators such that the integration cycles are staggered in time and such that every two sequentially occurring integration cycles partially overlap.

In some embodiments, the timing circuit initiates the integration cycles of the integrators such that a new cycle begins every $T/(2*k)$, where T is the period of the AC voltage and k is the number of integrators in the plurality.

In accordance with another aspect of the invention, a method for determining outages in an AC line voltage is disclosed. The method includes the steps of integrating the AC voltage on the line during a first integration cycle, integrating the AC voltage on the line during a second integration cycle, wherein the second integration cycle begins after the first integration cycle begins and before the first integration cycle ends, and sampling the integrated AC voltage at the end of the first integration cycle and at the end of the second integration cycle.

In some embodiments, the method further comprises the step of rectifying the AC voltage before integrating. Optionally, the first and second integration cycles may last for one-half the time period of the AC voltage.

In any of the foregoing embodiments successive integration cycles may begin every $T/(2*k)$, where T is the period of the AC voltage and k is the number of integrators employed. Additionally, the first and second integration cycles may optionally last for one-half the time period of the AC voltage.

In accordance with another aspect of the invention, an AC sensor for simultaneously sensing power outages and voltage on an AC line is provided. The AC sensor comprises a sensor developing multiple measurements of the voltage on the AC line during multiple, partially overlapping measurement periods. The measurements are representative of the average voltage on the AC line during their respective measurement periods. The sensor also includes a timing circuit defining the measurement periods such that a time delay between occurrence of a power outage on the AC line and detection by the sensor of the outage and a measurement of the average AC line voltage during a period when the outage occurs is less than one-quarter of the period of the voltage waveform.

In some embodiments, the time delay between occurrence of a power outage on the AC line and detection by the sensor is less than one-eighth of the period of the voltage waveform.

Other features and advantages are inherent in the apparatus claimed and disclosed or will become apparent to those skilled in the art from the following detailed description and its accompanying drawings.

DESCRIPTION OF THE PREFERRED EMBODIMENTS

Figure 2:
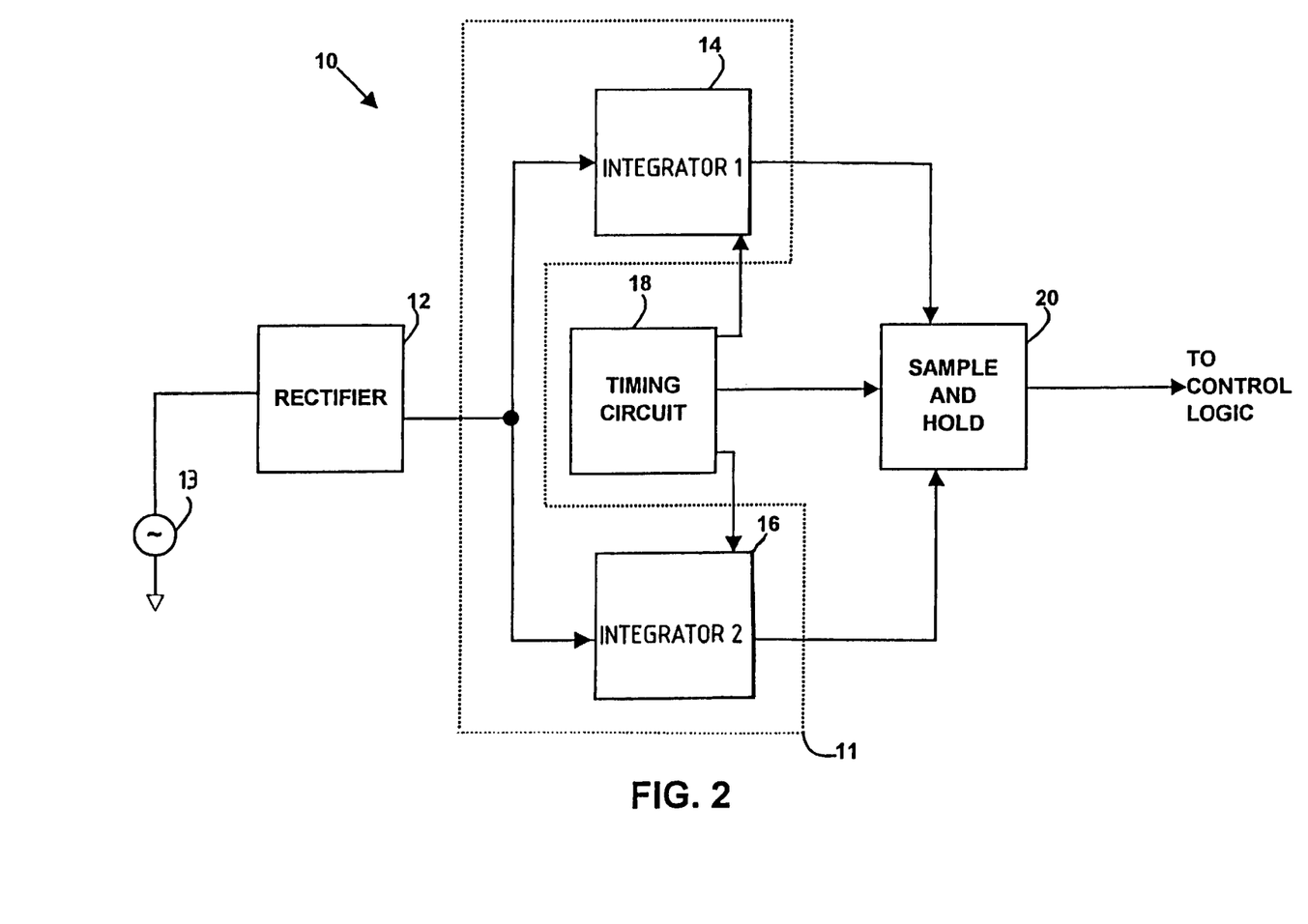
FIG. 2 is a block diagram of an AC sensor constructed in accordance with the teachings of the present invention.

A block diagram of an AC sensor 10 constructed in accordance with the teachings of the invention is illustrated in FIG. 2. Although the AC sensor 10 is shown being used to detect power outages and measure voltage on an AC power line, persons of ordinary skill in the art will readily appreciate that the teachings of the invention are not limited to any particular environment of use. On the contrary, the teachings of the invention are applicable to any environment where fast voltage measurement, fast current measurement and/or detection of power outages are useful or desired.

For the purpose of converting an AC signal into a unipolar voltage, the AC sensor 10 is provided with a rectifier 12. As shown in FIG. 2, the rectifier 12 is connected to an AC signal source 13 such as an AC power line. The AC signal source 13 provides AC signals having a frequency of Fac and a period of T. As will be appreciated by persons of ordinary skill in the art, the rectifier 12 may be implemented in many ways without departing from the scope and spirit of the invention. For example, the rectifier 12 may be implemented by a four-diode bridge that may employ a resistor divider. Alternatively, the rectifier 12 may be implemented by a precision rectifier. As will be further appreciated, the rectifier 12 may convert the negative half-cycles of a signal from the AC signal source 13 into positive half-cycles, or may convert the positive half-cycles of a signal from the signal source 13 into negative half-cycles without departing from the scope or spirit of the invention. Accordingly, the output of the rectifier 12 is a full-wave rectified AC signal having either all positive half-cycles or all negative half-cycles.

To develop multiple measurements of the voltage on the AC line during predetermined, multiple, partially overlapping measurement periods, the AC sensor is provided with a sensor circuit 11. As shown in FIG. 2, the sensor circuit 11 is preferably implemented by at least two integrators 14, 16. The integrators 14, 16 each separately integrate the rectified AC signal over predetermined time periods, which preferably have a duration of one-half of the period of the AC signal (T). Integration over one-half of the period of the AC signal guarantees that the output of the integrators 14, 16 will be proportional to the average value of the AC signal during the measurement time regardless of when the integration begins with respect to the AC signal. As explained below, the integration cycles of the integrators 14, 16 are staggered in time relative to one another.

In order to control the relative timing of the integration periods of the integrators 14, 16 such that the start time of one of the integrators 14, 16 occurs after the start time but before the end time of the other integrator 14, 16, the AC sensor 10 is further provided with a timing circuit 18. As discussed further below, the timing circuit 18 preferably initiates the integration cycles of the integrators 14, 16 such that the integration cycles are staggered in time and such that every two sequentially occurring integration cycles partially overlap. For example, in a system having two integrators, each of the integration cycles of the integrators has a start time and an end time such that the start time of the second integration cycle is before the end of the first integration cycle.

For the purpose of periodically sampling and storing the measurements developed by the integrators 14, 16 and for outputting the sampled measurements to an external control logic circuit (not shown) the AC sensor is provided with a sample and hold circuit 20. As shown in FIG. 2, the timing circuit 18 is in communication with the sample and hold circuit 20. The timing circuit 18 is preferably adapted to control and synchronize the sampling function of the sample and hold circuit 20 with the termination of the integration periods of the integrators 14, 16. The sample and hold circuit 20 constitutes the output stage of the sensor 10. A conventional control logic circuit (not shown) such as a microprocessor can be programmed to interpret the output of the sample and hold circuit 20 and to connect a conventional back-up supply to the load when an outage is detected. As explained in detail below, the disclosed circuit will detect outages and simultaneously report the AC line voltage to the control logic in one-half the response time typically associated with prior art sensors or less (i.e., within one-quarter period of the AC line voltage waveform or less).

Figure 3:
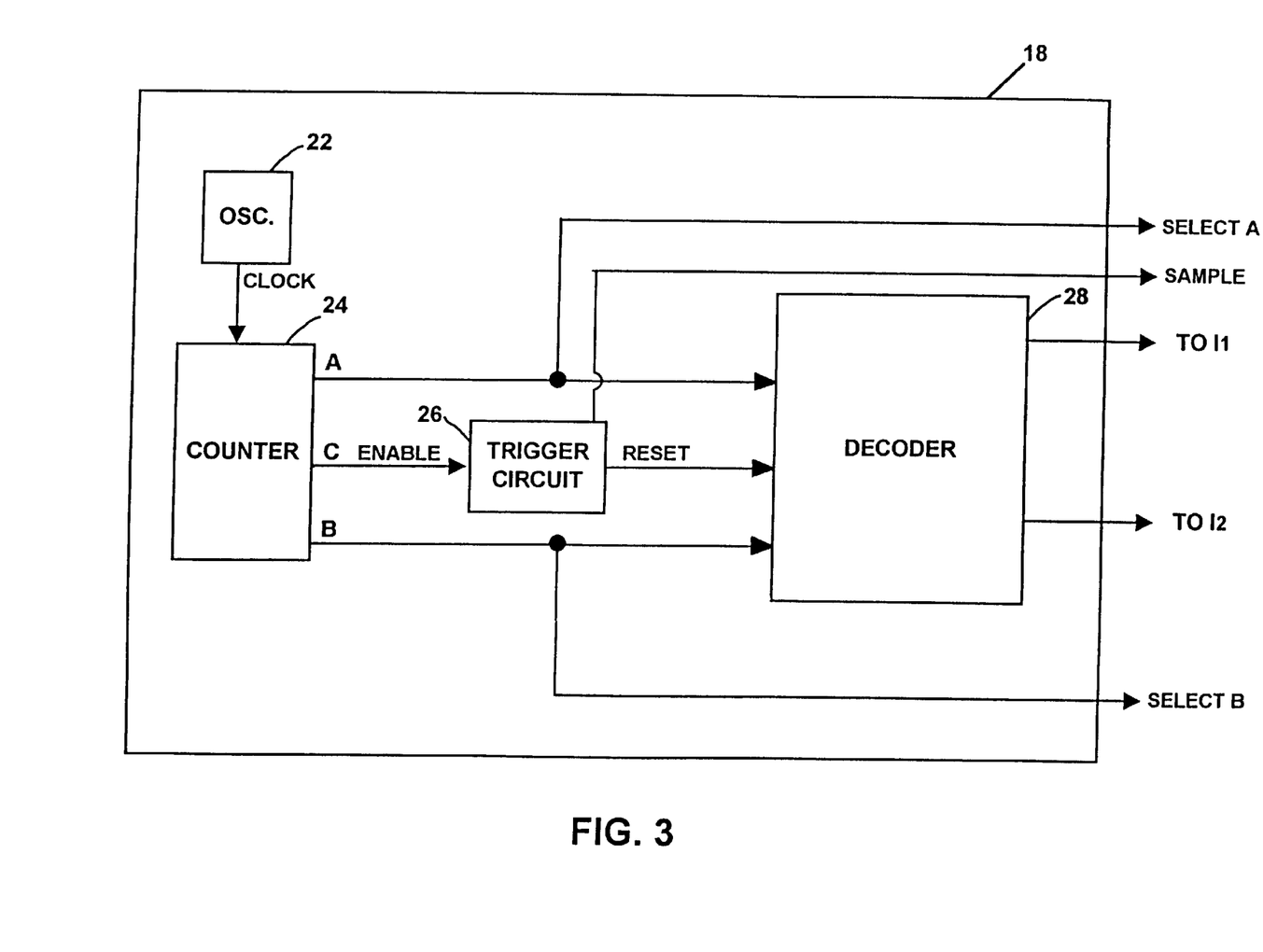
FIG. 3 is a detailed block diagram of the timing circuit of FIG. 2.

A more detailed block diagram illustrating one possible implementation of the timing circuit is shown in FIG. 3. Turning to that figure, to generate a clock signal, the timing circuit 18 is provided with an oscillator 22 and a counter 24. In the preferred embodiment, the frequency of the oscillator 22 is $Fcl=2^N*2*k*Fac$, where Fac is the frequency of the AC signal provided by the AC signal source 13, k is the number of integrators used in the AC sensor, and N is the lowest index of the counter output. For example, if $Q_N$, $Q_{N+1}$ and $Q_{N+2}$ are outputs of a counter, $Q_N$ will be the lowest index of the counter. However, persons of ordinary skill in the art will readily appreciate that other frequencies can be chosen without departing from the scope or spirit of the invention.

To generate a number of different clock signals that are lower in frequency than the signal generated by the oscillator 22, the timing circuit 18 is provided with the counter 24. The counter 24 is preferably implemented by a binary counter that is clocked by the output of the oscillator 22. As shown in FIG. 3, the counter may have three output signals denoted as A, B, and C, wherein signals A and B may be referred to as select signals and signal C may be referred to as an enable signal. The select signals may be synchronized to encode a binary number. Signals A, B, and C are selected such that signal C is twice the frequency of signal A and four times the frequency of signal B. Additionally, the lowest frequency of signals A, B or C is preferably not less than twice Fac. For example, the frequencies of signals C, A, and B may be eight, four, and two times Fac, respectively. In addition to controlling other components in the timing circuit 18, the two select signals (e.g., signals A and B) are used to control the sample and hold circuit 20 shown in FIG. 2.

For the purpose of generating control signals, the timing circuit 18 is provided with a trigger circuit 26. The trigger circuit 26 receives its input signal from one of the three output signals A, B, C of the counter 24. As shown in FIG. 3, signal C (the enable signal) is coupled from the counter 24 to the trigger circuit 26. The trigger circuit 26, in turn, generates first and second output signals, which may be referred to as sample and reset signals, respectively. The reset signal is delayed in time with respect to the sample signal, such that a state transition of the reset signal is preceded by a state transition of the sample signal. The sample signal is provided to the sample and hold circuit 20 and the reset signal is coupled to a decoder 28.

Figure 4:
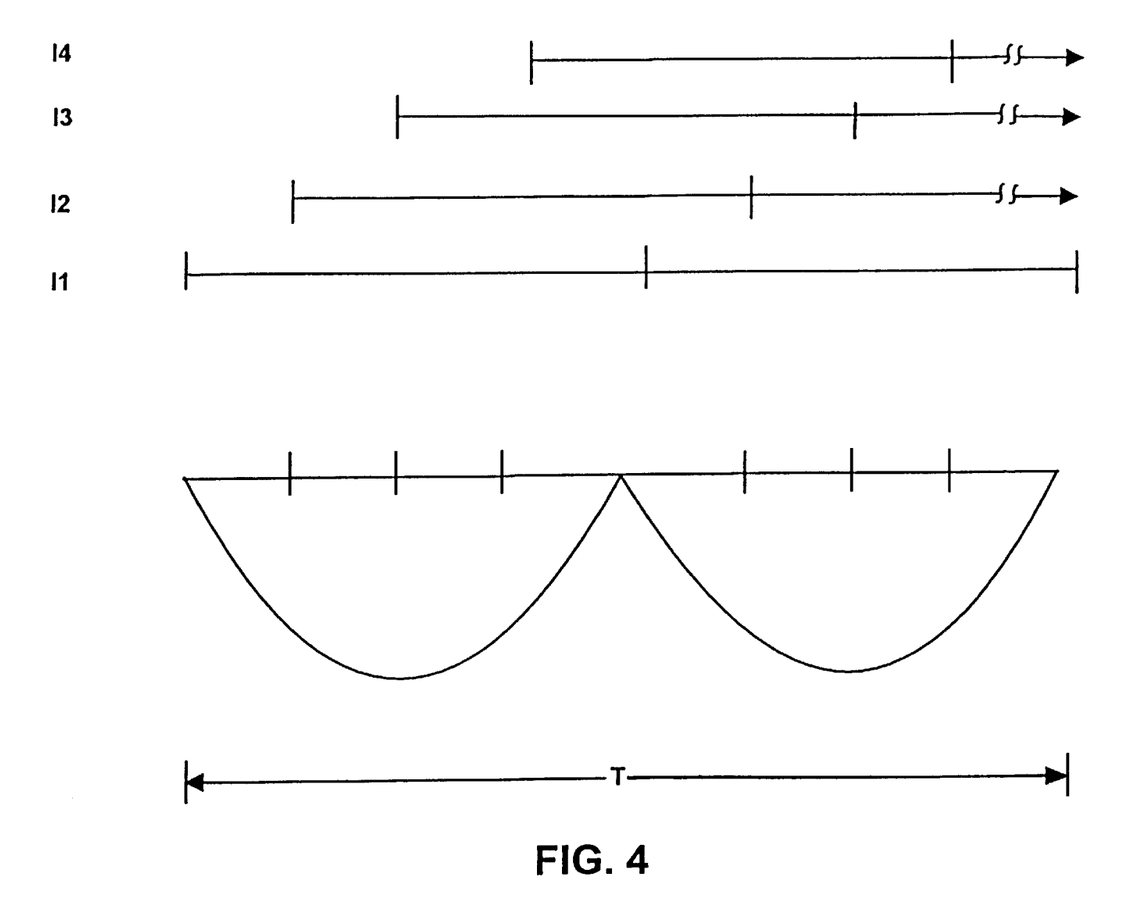
FIG. 4 is a diagram illustrating the integration cycles of an AC sensor operating in accordance with the teachings of the present invention and employing four integrators.

To control the integration timing of the integrators 14, 16, the timing circuit 18 is provided with a decoder 28. As mentioned above, the integrators 14, 16 have offset integration periods. The start times and end times of the integration cycles are determined by signals from the decoder 28 of the timing circuit 18. Preferably, if there are two integrators, the integration period of one of the integrators begins half way through the integration period of the other integrator. If four integrators are used and each integration cycle is one-half the period of the rectified AC signal, each integration cycle will preferably begin one-quarter of an integration period after the previously commenced integration cycle. For example, as shown in FIG. 4, four integrators (I1–I4) are used to integrate the negative full-wave rectified signal. The integration period of I1 begins at the start of the first negative half-cycle, ends at the end of the first negative half-cycle, and after being reset begins another integration cycle. Integrators I2–I4 begin their integration cycles one-quarter of a half-cycle apart from one another. Each integration period lasts for one half-cycle, such that each cycle yields an integration product equal to the average voltage of the corresponding half-cycle. Because the integration periods are staggered in time, the results produced by the integrators are also staggered in time. As a result, power outages on the AC line may be rapidly detected. Since an integrator generates an output every quarter of a half cycle, (i.e., outputs are generated eight times an AC line cycle), a voltage drop at any point in the half-cycle will be reflected in the output of an integrator no more than one-quarter of a half-cycle after the voltage drop occurs. After each integrator 14, 16 completes an integration cycle, it is reset and immediately begins integrating again. Because the integration period is one half-cycle, the result of every integration cycle will yield the same average voltage value, provided the magnitude of the AC signal does not change. Although the integration cycle for integrator I1 is shown as synchronous with the rectified AC signal, persons skilled in the art will readily recognize the integration periods may be asynchronous with respect to the rectified AC signal. Because the integration cycles are preferably ½ T, the result of integration will be identical whether the integration cycle is synchronous or asynchronous with respect to the rectified AC signal.

Returning to FIG. 3, the decoder 28 receives two inputs (e.g., A and B) from the counter 24 and the reset signal from the trigger circuit 26. As is well known in the art, an N-input decoder has $2^N$ outputs. Each of the outputs corresponds to a particular unique binary input. For example, if a binary "01" is input to the decoder, a binary "1" will be present on one of the output pins of the decoder that corresponds to an input of binary "01". The reset signal from the trigger circuit 26 is used to enable or disable the decoder 28. For example, when the reset signal is low, the outputs of the decoder 28 will correspond to the binary input such that the integrator corresponding to the binary input number will be reset. However, when the reset signal is high, the outputs of the decoder 28 will all be in the low state and will not change when the binary inputs to the decoder change.

Figure 5:
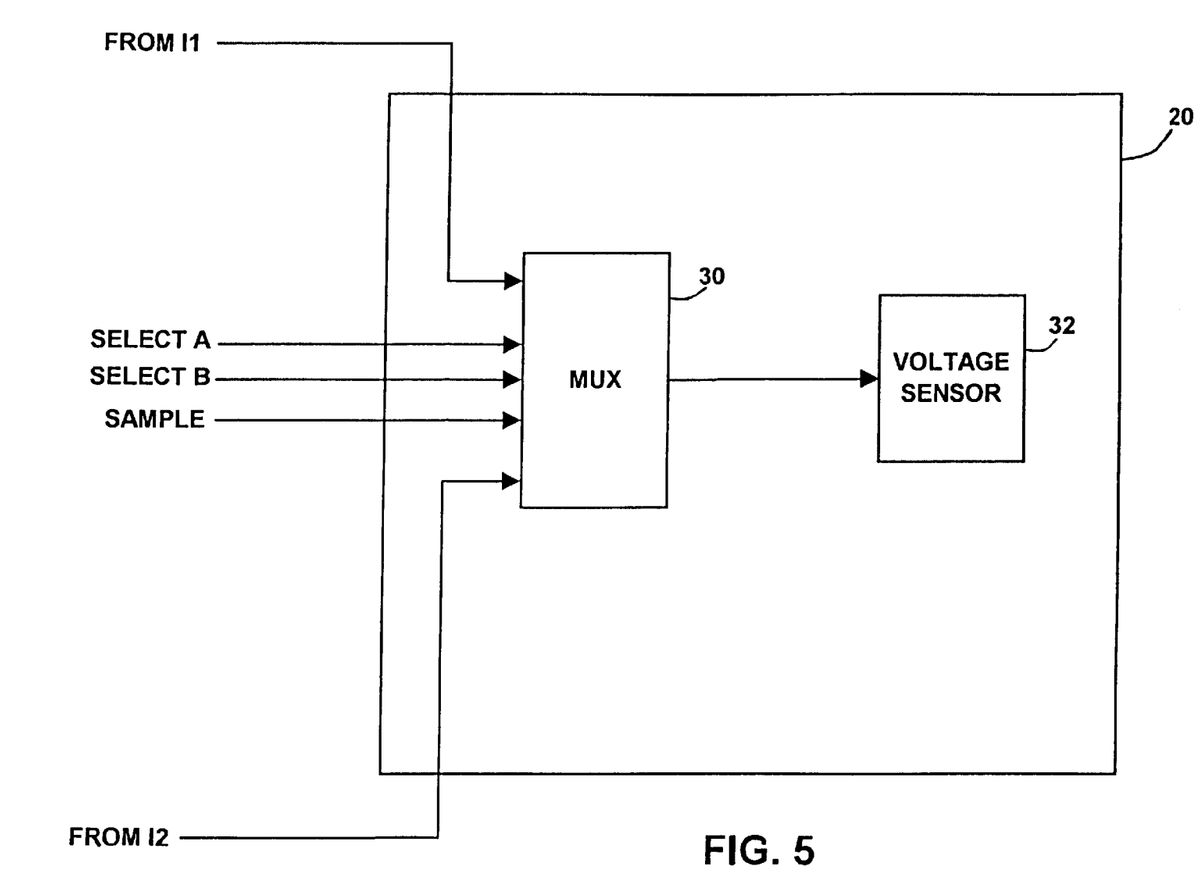
FIG. 5 is a detailed block diagram of the sample and hold circuit of FIG. 2.

As shown in FIGS. 3 and 5, the timing circuit 18 provides address (or select) lines (e.g., A and B) from the counter 24 and the sample signal from the trigger circuit 26 to the sample and hold circuit 20. The sample and hold circuit 20, which is controlled by the sample signal, periodically samples and stores signals provided by the integrators. As shown in FIG. 5, the sample and hold circuit 20 includes a multiplexer 30 and a voltage sensor 32. The multiplexer 30 receives as inputs the outputs from each integrator 14, 16, as well as select lines and the sample signal from the timing circuit 18. As will be appreciated by persons skilled in the art, a multiplexer is a many-to-one device that provides for the output of one signal selected from a number of input signals. In the illustrated sensor, the multiplexer 30, is controlled by the select lines and the sample line. During operation, output signals from the integrators 14, 16 are fed to the multiplexer 30. The select lines from the timing circuit 18 are used to select which of the integrator outputs will be output from the multiplexer 30. However, the multiplexer 30 output will be disconnected from any of the inputs unless the sample line is in the proper state. The proper state of the sample line may be either high or low depending on the multiplexer selected when constructing the sensor 10. Additionally, because the sample signal leads the reset signal, the output of the multiplexer 30 will be selected before the integrator associated with that output is reset to begin another integration cycle.

For the purpose of measuring the AC voltage and determining when there is low voltage on the AC line 13, a voltage sensor 32 is provided. The voltage sensor 32 receives its input from the multiplexer 30 and is capable of detecting a range of output values from the integrator that indicate that that voltage on the AC line 13 has fallen to an unacceptable level. In keeping with the present invention, the voltage sensor 32 may have an output (not shown) that is used to enable other circuitry when the voltage on the AC line 13 falls to an unacceptable level. Specifically, the voltage sensor 32 can optionally be implemented by the logic circuit discussed above.

Figure 6A:
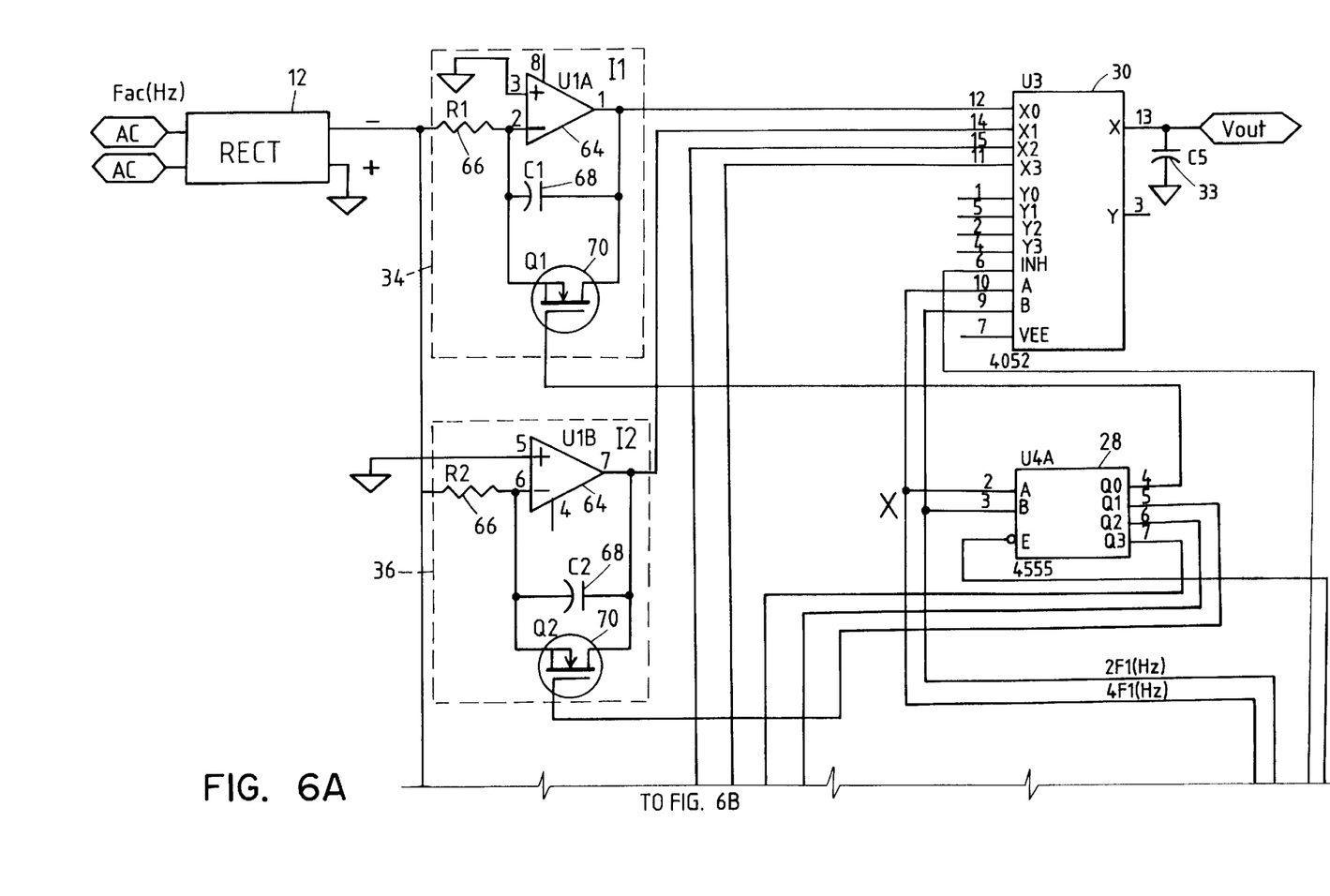
FIGS. 6A and 6B together form a detailed schematic representation of an AC sensor constructed in accordance with the teachings of the present invention.
Figure 6B:
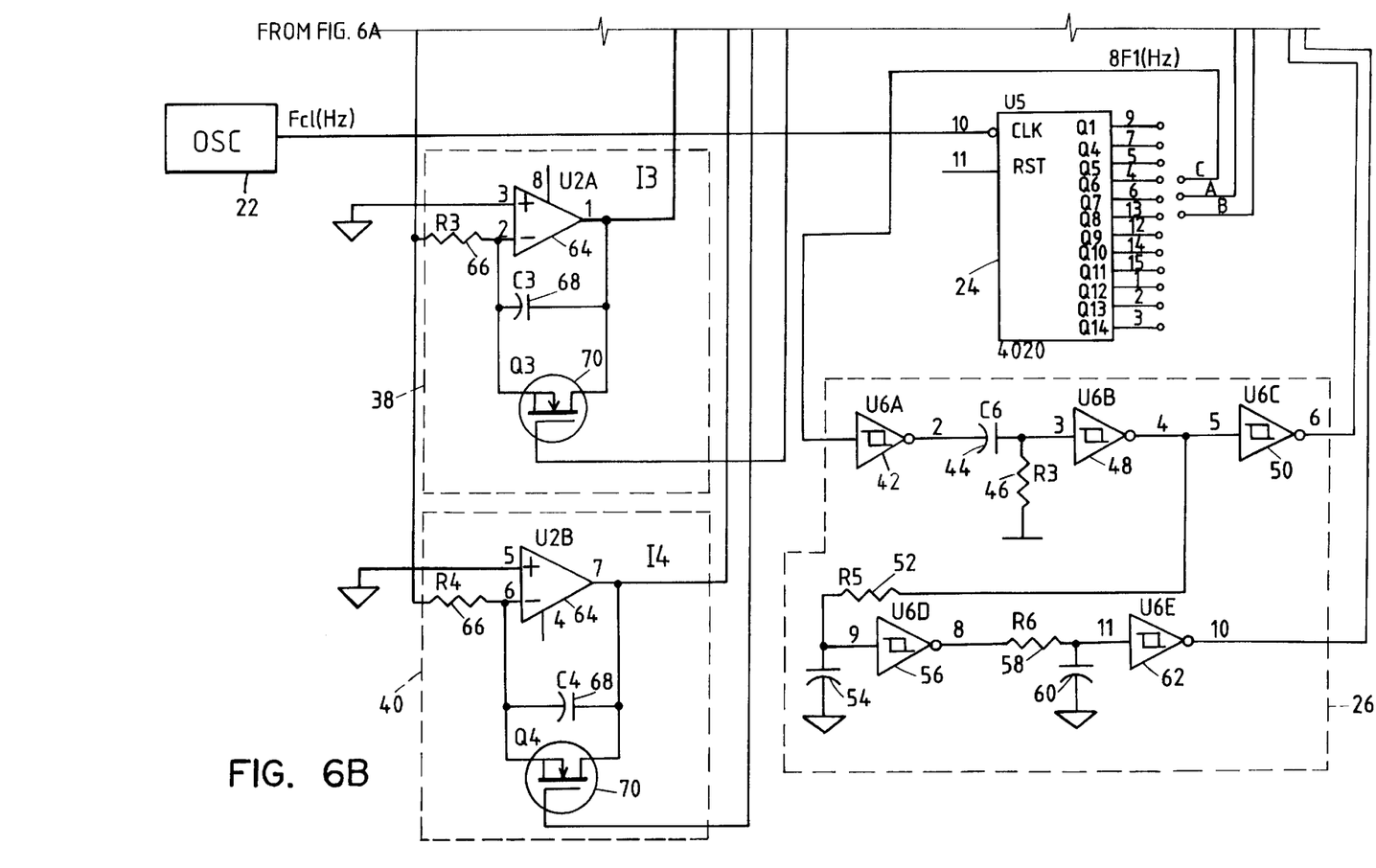

A detailed schematic representation of the AC sensor 10 is shown in FIGS. 6A and 6B. The circuit of FIGS. 6A–6B includes the rectifier 12, the oscillator 22, the counter 24, the trigger circuit 26, the decoder 28, the multiplexer 30, an output capacitor 33 and a set of integrators 34, 36, 38, 40 as discussed above. During operation, the rectifier 12 rectifies the voltage from the AC source 13. The rectified voltage is coupled to each of the integrators 34, 36, 38, 40 for integration. The oscillator 22 provides a clock signal to the counter 24, which produces signals that are two, four, and eight times the frequency of the AC signal. The signals that are two and four times the frequency of the AC signal (i.e., signals B and A) are used to address the decoder 28 and the multiplexer 30. The signal eight times the AC signal (i.e., signal C) is coupled to the trigger circuit 26, which selectively enables the decoder 28 and the multiplexer 30 to both read the integrated voltages output from the integrators 34, 36, 38, 40 and to reset the integrators 34, 36, 38, 40.

More specifically, the trigger circuit 26 receives a digital signal as its input from the counter 24. The purpose of the trigger circuit 26 is to generate a signal that allows the multiplexer 30 to select an output from one of the integrators 34, 36, 38, 40 and to, after some delay, generate a signal that allows the decoder 28 to reset an integrator 34, 36, 38, 40 after its output has been coupled to the output of the multiplexer 30, which is connected to the output capacitor 33. The output capacitor 33 is charged by the integrator output voltage that is selected and output by the multiplexer 30. At the end of each integration cycle the output capacitor 33 is charged by the multiplexer 30. Accordingly, the DC voltage across the output capacitor 33 provides precise information about the average value of the AC voltage for the last period of integration. The output capacitor 33 is charged by the output of the multiplexer eight times during each cycle of the AC voltage from the signal source 13.

The input to the trigger circuit 26 is passed through a first Schmitt Trigger inverter 42, which inverts the sense of the digital signal and passes the inverted signal to a series capacitor 44 that is connected to a shunt resistor 46. Together the capacitor 44 and the resistor 46 perform the function of forming a pulse width. This pulse width is preferably 2 microseconds (us) if the frequency of the AC signal source 13 is 60 Hertz. The voltage from the shunt resistor 46 is coupled to a second Schmitt Trigger inverter 48, which is in turn connected to a third Schmitt Trigger inverter 50. The signal output from the third Schmitt Trigger inverter 50 is used as the sample signal for the multiplexer 30. The output of the second Schmitt Trigger inverter 48 is also connected to a series resistor 52, which is connected to a shunt capacitor 54. The series resistor 52 and the shunt capacitor 54 provide a second delay that is preferably 2 us. The shunt capacitor 54 is coupled to a fourth Schmitt Trigger inverter 56, the output of which is connected to second series resistor 58 having a second shunt capacitor 60, which creates another delay. The voltage on the second shunt capacitor 60 is coupled to a fifth Schmitt Trigger inverter 62 that outputs a reset signal to the decoder 28. The reset signal is delayed in time from the sample signal so that the voltage from an integrator 34, 36, 38 or 40 may be read using the multiplexer 30 that is controlled by the sample signal, before that integrator 34, 36, 38 or 40 is reset by the decoder 28 that is controlled by the reset signal. The reset signal that is coupled to the decoder 28 controls the decoder 28 so that the integration periods of the integrators 34, 36, 38, 40 are similar to those integration periods shown in FIG. 4.

The integrators 34, 36, 38, 40 each include an operational amplifier (op-amp) 64 having an input resistor 66, a feedback capacitor 68, and a field effect transistor (FET) 70. During the operation of any given integrator 34, 36, 38, 40, the rectified AC voltage from the rectifier 12 is coupled through the input resistor 66 and into the op-amp 68. The op-amp 68 in conjunction with the feedback capacitor 68 and the input resistor 66 integrates the input voltage from the rectifier 12. The FET 70 that is connected across the feedback capacitor 68 is used to reset the integrator when the integration cycle is to be terminated. The gates of the FETs 70 are connected to the decoder 28 in such a manner that, when the corresponding integrator 34, 36, 38 or 40 is to be reset, the decoder 28 causes the appropriate FET 70 to short-out the feedback capacitor 68, thereby discharging the capacitor and resetting the associated integrator 34, 36, 38 or 40.

In summary, persons of ordinary skill in the art will appreciate that an AC sensor that simultaneously detects power outages and develops accurate measurements of the AC line voltage has been disclosed. Unlike prior art sensors the disclosed circuit 10 detects outages and reports the measured AC line voltage within one-quarter of the period of the AC line voltage waveform or less, depending on the number of integrators employed by the AC sensor.

Although, the circuit shown in FIGS. 6A and 6B employs four integrators, it will be appreciated by persons of ordinary skill in the art that any number of integrators may be used without departing from the scope or spirit of the invention. Furthermore, those skilled in the art will further appreciate that, although the invention has been described in connection with certain embodiments, there is no intent to limit the invention thereto. On the contrary, the intention of this application is to cover all modifications and embodiments fairly falling within the scope of the appended claims either literally or under the doctrine of equivalents.

What is claimed is:

1. An AC sensor for detecting outages on an AC power line comprising:
   a first integrator for integrating an AC voltage on the AC power line during a first predetermined time period, the first predetermined time period having a first start time and a first end time;
   a second integrator for integrating the AC voltage on the power line during a second predetermined time period, the second predetermined time period having a second start time and a second end time;
   a timing circuit in communication with the first and second integrators for determining the first and second start times and the first and second end times such that the second start time occurs after the first start time and before the first end time; and
   an output sensor communicatively coupled to the first and second integrators to detect an outage on the AC power line.

2. A sensor as defined in claim 1 further comprising a sample and hold circuit in communication with the first and second integrators, the sample and hold circuit periodically sampling and storing a first output voltage developed by the first integrator and a second output voltage developed by the second integrator.

3. A sensor as defined in claim 2 wherein the sample and hold circuit samples the first output voltage at the end of the first predetermined time period.

4. A sensor as defined in claim 3 wherein the sample and hold circuit samples the second output voltage at the end of the second predetermined time period.

5. A sensor as defined in claim 2 wherein the sample and hold circuit is in communication with the timing circuit and the timing circuit defines the times at which the sample and hold circuit samples the first and second output voltages.

6. A sensor as defined in claim 2 wherein the sample and hold circuit comprises:
   a multiplexer having an output, a first input coupled to an output of the first integrator, and a second input coupled to an output of the second integrator; and
   a capacitor coupled to the output of the multiplexer.

7. A sensor as defined in claim 1 further comprising:
   a rectifier having an input coupled to the AC power line and an output coupled to respective inputs of the first and second integrators for providing a rectified AC voltage thereto.

8. A sensor as defined in claim 1 wherein the first predetermined time period lasts for one-half a period of the AC voltage.

9. A sensor as defined in claim 8 wherein the second predetermined time period lasts for one-half the period of the AC voltage.

10. A sensor as defined in claim 1 wherein the AC voltage has a phase, and the first and second predetermined time periods are asynchronous with the phase of the AC voltage.

11. A sensor as defined in claim 2 wherein the timing circuit comprises:
    an oscillator which develops a clock signal;
    a counter in communication with the oscillator, the counter being responsive to the clock signal to develop a select signal and an enable signal;
    a trigger circuit in communication with the counter, the trigger circuit being responsive to the enable signal to develop a first output signal; and
    a decoder in communication with the counter and the trigger circuit, the decoder being responsive to the first output signal to output a first reset signal to the first integrator when the select signal has a first state, and to output a second reset signal to the second integrator when the select signal has a second state.

12. A sensor as defined in claim 11 further comprising a sample and hold circuit in communication with the first and second integrators, the sample and hold circuit periodically sampling and storing a first output voltage developed by the first integrator and a second output voltage developed by the second integrator.

13. A sensor as defined in claim 12 wherein the trigger circuit develops a second output signal in response to the enable signal, the trigger circuit is in communication with the sample and hold circuit, and the sample and hold circuit is responsive to the second output signal to sample the first output voltage from the first integrator when the select signal has the first state, and to sample the second output voltage from the second integrator when the select signal has the second state.

14. A sensor as defined in claim 13 wherein the first output signal of the trigger circuit is delayed relative to the second output signal.

15. A sensor as defined in claim 14, wherein the select signal encodes a binary number.

16. A sensor as defined in claim 11 wherein the select signal comprises at least two synchronized signals encoding a binary number.

17. A sensor as defined in claim 11 wherein the clock signal has a frequency which is related to the frequency of the AC voltage by the equation $Fcl=2^{N}*2*k*Fac$, where Fac is the frequency of the AC signal provided by the AC signal source, k is the number of integrators used in the AC sensor, and N is the lowest index of the counter output.

18. A sensor as defined in claim 11 wherein the trigger circuit comprises a Schmitt Trigger inverter and an RC circuit.

19. An AC sensor for detecting outages on an AC power line comprising:
    a plurality of integrators for independently integrating an AC voltage on the AC power line, each of the integrators having an integration cycle;
    a timing circuit in communication with the integrators, the timing circuit initiating the integration cycles of the integrators such that the integration cycles are staggered in time and such that every two sequentially occurring integration cycles partially overlap; and
    an output sensor communicatively coupled to the plurality of integrators to detect an outage on the AC power line.

20. A sensor as defined in claim 19 wherein the timing circuit initiates the integration cycles of the integrators such that a new cycle begins every $T/(2*k)$, where T is the period of the AC voltage and k is the number of integrators in the plurality.

21. A method for determining outages in an AC line voltage comprising the steps of:
    integrating the AC voltage on the line during a first integration cycle;
    integrating the AC voltage on the line during a second integration cycle, wherein the second integration cycle begins after the first integration cycle begins, and before the first integration cycle ends; and
    sampling the integrated AC voltage at the end of the first integration cycle and at the end of the second integration cycle.

22. A method as defined in claim 21 further comprising the step of rectifying the AC voltage before integrating.

23. A method as defined in claim 21 wherein the first and second integration cycles last for one-half the time period of the AC voltage.

24. A method as defined in claim 21 wherein successive integration cycles begin every T/(2*k), where T is the period of the AC voltage and k is the number of integrators employed.

25. A method as defined in claim 24 wherein the first and second integration cycles last for one-half the time period of the AC voltage.

26. An AC sensor for simultaneously sensing power outages and voltage on an AC line, the voltage on the AC line defining a waveform with a period, the AC sensor comprising:

a sensor developing multiple measurements of the voltage on the AC line during multiple, partially overlapping measurement periods, the measurements being representative of the average voltage on the AC line during their respective measurement periods; and a timing circuit defining the measurement periods such that a time delay between occurrence of a power outage on the AC line and detection of the outage and measurement of the average AC line voltage by the sensor during a period when the outage occurs is less than one-quarter of the period of the voltage waveform.

27. An AC sensor as defined in claim 26, wherein the time delay is approximately one-eighth of the period of the voltage waveform.

28. An AC sensor for detecting outages on an AC power line comprising:

a first integrator for integrating an AC voltage on the AC power line during a first predetermined time period, the first predetermined time period having a first start time and a first end time;

a second integrator for integrating the AC voltage on the power line during a second predetermined time period, the second predetermined time period having a second start time and a second end time;

a timing circuit in communication with the first and second integrators for determining the first and second start times and the first and second end times such that the second start time occurs after the first start time and before the first end time; and a sample and hold circuit in communication with the first and second integrators, the sample and hold circuit periodically sampling and storing a first output voltage developed by the first integrator and a second output voltage developed by the second integrator.

29. A sensor as defined in claim 28 wherein the sample and hold circuit samples the first output voltage at the end of the first predetermined time period.

30. A sensor as defined in claim 29 wherein the sample and hold circuit samples the second output voltage at the end of the second predetermined time period.

31. A sensor as defined in claim 28 wherein the sample and hold circuit is in communication with the timing circuit and the timing circuit defines the times at which the sample and hold circuit samples the first and second output voltages.

32. A sensor as defined in claim 28 wherein the sample and hold circuit comprises:

a multiplexer having an output, a first input coupled to an output of the first integrator, and a second input coupled to an output of the second integrator; and a capacitor coupled to the output of the multiplexer.

33. A sensor as defined in claim 28 wherein the timing circuit comprises:

an oscillator which develops a clock signal;

a counter in communication with the oscillator, the counter being responsive to the clock signal to develop a select signal and an enable signal;

a trigger circuit in communication with the counter, the trigger circuit being responsive to the enable signal to develop a first output signal; and a decoder in communication with the counter and the trigger circuit, the decoder being responsive to the first output signal to output a first reset signal to the first integrator when the select signal has a first state, and to output a second reset signal to the second integrator when the select signal has a second state.

34. A sensor as defined in claim 33 wherein the trigger circuit develops a second output signal in response to the enable signal, the trigger circuit is in communication with the sample and hold circuit, and the sample and hold circuit is responsive to the second output signal to sample the first output voltage from the first integrator when the select signal has the first state, and to sample the second output voltage from the second integrator when the select signal has the second state.

35. A sensor as defined in claim 34 wherein the first output signal of the trigger circuit is delayed relative to the second output signal.

36. A sensor as defined in claim 35, wherein the select signal encodes a binary number.

37. A sensor as defined in claim 33 wherein the select signal comprises at least two synchronized signals encoding a binary number.

38. A sensor as defined in claim 33 wherein the clock signal has a frequency which is related to the frequency of the AC voltage by the equation Fcl=2N*2*k*Fac, where Fac is the frequency of the AC signal provided by the AC signal source, k is the number of integrators used in the AC sensor, and N is the lowest index of the counter output.

39. A sensor as defined in claim 33 wherein the trigger circuit comprises a Schmitt Trigger inverter and an RC circuit.

40. An AC sensor for detecting outages on an AC power line comprising:

a first integrator for integrating an AC voltage on the AC power line during a first predetermined time period, the first predetermined time period having a first start time and a first end time;

a second integrator for integrating the AC voltage on the power line during a second predetermined time period, the second predetermined time period having a second start time and a second end time;

a timing circuit in communication with the first and second integrators for determining the first and second start times and the first and second end times such that the second start time occurs after the first start time and before the first end time; and a rectifier having an input coupled to the AC power line and an output coupled to respective inputs of the first and second integrators for providing a rectified AC voltage thereto.

41. An AC sensor for detecting outages on an AC power line comprising:

a first integrator for integrating an AC voltage on the AC power line during a first predetermined time period, the first predetermined time period having a first start time and a first end time; and a second integrator for integrating the AC voltage on the power line during a second predetermined time period, the second predetermined time period having a second start time and a second end time;

a timing circuit in communication with the first and second integrators for determining the first and second start times and the first and second end times such that the second start time occurs after the first start time and before the first end time, wherein the first predetermined time period lasts for one-half a period of the AC voltage.

42. A sensor as defined in claim 41 wherein the second predetermined time period lasts for one-half the period of the AC voltage.

43. An AC sensor for detecting outages on an AC power line comprising:

a plurality of integrators for independently integrating an AC voltage on the AC power line, each of the integrators having an integration cycle; and a timing circuit in communication with the integrators, the timing circuit initiating the integration cycles of the integrators such that the integration cycles are staggered in time and such that every two sequentially occurring integration cycles partially overlap, wherein the timing circuit initiates the integration cycles of the integrators such that a new cycle begins every $T/(2*k)$, where T is the period of the AC voltage and k is the number of integrators in the plurality.

* * * * *